(12) United States Patent
Jhooti (10) Patent No.: US 7,570,052 B2
(45) Date of Patent: Aug. 4, 2009

(54) MRI IMAGING OF AN OBJECT IN CYCLIC MOTION

(75) Inventor: Permjit Jhooti, London (GB)

(73) Assignee: Royal Brompton & Harefield NHS Trust, London (GB)

( * ) Notice: Subject to any disclaimer, the term of this patent is extended or adjusted under 35 U.S.C. 154(b) by 15 days.

(21) Appl. No.: 11/908,328

(22) PCT Filed: Mar. 3, 2006

(86) PCT No.: PCT/GB2006/000757

§ 371 (c)(1),
(2), (4) Date: Sep. 11, 2007

(87) PCT Pub. No.: WO2006/095142

PCT Pub. Date: Sep. 14, 2006

(65) Prior Publication Data

US 2008/0150529 A1      Jun. 26, 2008

(30) Foreign Application Priority Data

Mar. 11, 2005  (GB) ................................. 0505043.0
May 3, 2005    (GB) ................................. 0508943.8

(51) Int. Cl.
*G01V 3/00* (2006.01)
(52) U.S. Cl. .................................................... 324/309
(58) Field of Classification Search ......... 324/300–322; 600/410–435; 382/128–134, 286–301; 702/19–32, 702/94–95, 150–172
See application file for complete search history.

(56) References Cited

U.S. PATENT DOCUMENTS

| 4,720,678 A | 1/1988 | Glover et al. |
| 4,724,386 A | 2/1988 | Haacke et al. |
| 6,528,996 B1* | 3/2003 | Sato ........................... 324/307 |
| 6,882,148 B2* | 4/2005 | Pipe ........................... 324/307 |
| 7,030,609 B2* | 4/2006 | Pipe ........................... 324/309 |
| 7,205,763 B2* | 4/2007 | Porter ........................ 324/306 |
| 7,382,127 B2* | 6/2008 | Gaddipati et al. ........... 324/309 |
| 2008/0021304 A1* | 1/2008 | Stemmer ..................... 600/410 |
| 2008/0129289 A1* | 6/2008 | Stemmer et al. ............ 324/309 |

(Continued)

FOREIGN PATENT DOCUMENTS

WO    01/14901    3/2001

(Continued)

OTHER PUBLICATIONS

P. Jhooti, D. Firmin, Improved Scan Efficiency using Multiple Interleave Acquisitions for Optimal Windows, Mar. 2005, 2669.

(Continued)

*Primary Examiner*—Brij B. Shrivastav
*Assistant Examiner*—Dixomara Vargas
(74) *Attorney, Agent, or Firm*—Renner, Otto, Boisselle & Sklar, LLP (57) ABSTRACT

A method of generating an MRI image of an object in cyclic motion by acquiring ky line data in a spaced apart fashion over ky space using a predefined order for line acquisition for each of a number of position bands. The acquisition orders for adjacent bands are circularly shifted with respect to each other.

11 Claims, 5 Drawing Sheets

U.S. PATENT DOCUMENTS

2008/0214923 A1* 9/2008 Krueger et al. ............. 600/410

FOREIGN PATENT DOCUMENTS

WO 03/079036 9/2003

OTHER PUBLICATIONS

P. Jhooti, P.D. Gatehouse, J. Keegan, N.H. Bunce, A.M. Taylor, D.N. Firmin, Phase Ordering with Automatic Window Selection (PAWS): A novel Motion Resistant Technique for 3d Coronary Imaging, Magnetic Resonance in Medicine 43:470-480, 2000.

Todd Sachs, Craig Meyes, Pablo Irarrazabal, Bob Hu, Dwight Nishimura, Albert Macovski; The Diminishing Variance Algorithm for Real-Time Reduction of Motion Artifacts in MRI; 8306 Magnetic Resonance in Medicine 412-422, 1995.

* cited by examiner

Line acquisition order - same direction

| subset 1 | | | | subset 2 | | | subset 3 | | | subset 4 | | | subset 5 | | |
|---|---|---|---|---|---|---|---|---|---|---|---|---|---|---|---|
| 0 | 5 | 10 | 15 | 2 | 7 | 12 | 4 | 9 | 14 | 1 | 6 | 11 | 3 | 8 | 13 |

Line acquisition order - alternating direction

| subset 1 | | | | subset 2 | | | subset 3 | | | subset 4 | | | subset 5 | | |
|---|---|---|---|---|---|---|---|---|---|---|---|---|---|---|---|
| 0 | 5 | 10 | 15 | 12 | 7 | 2 | 4 | 9 | 14 | 11 | 6 | 1 | 3 | 8 | 13 |

Figure 5(a)

ky line acquisition order

| Position band number | | | | | | | | | | | | | | | |
|---|---|---|---|---|---|---|---|---|---|---|---|---|---|---|---|
| 1 | 0 | 5 | 10 | 15 | 12 | 7 | 2 | 4 | 9 | 14 | 11 | 6 | 1 | 3 | 8 | 13 |
| 2 | 13 | 0 | 5 | 10 | 15 | 12 | 7 | 2 | 4 | 9 | 14 | 11 | 6 | 1 | 3 | 8 |
| 3 | 8 | 13 | 0 | 5 | 10 | 15 | 12 | 7 | 2 | 4 | 9 | 14 | 11 | 6 | 1 | 3 |
| 4 | 3 | 8 | 13 | 0 | 5 | 10 | 15 | 12 | 7 | 2 | 4 | 9 | 14 | 11 | 6 | 1 |
| 5 | 1 | 3 | 8 | 13 | 0 | 5 | 10 | 15 | 12 | 7 | 2 | 4 | 9 | 14 | 11 | 6 |
| 6 | 6 | 1 | 3 | 8 | 13 | 0 | 5 | 10 | 15 | 12 | 7 | 2 | 4 | 9 | 14 | 11 |
| 7 | 11 | 6 | 1 | 3 | 8 | 13 | 0 | 5 | 10 | 15 | 12 | 7 | 2 | 4 | 9 | 14 |
| 8 | 14 | 11 | 6 | 1 | 3 | 8 | 13 | 0 | 5 | 10 | 15 | 12 | 7 | 2 | 4 | 9 |
| 9 | 9 | 14 | 11 | 6 | 1 | 3 | 8 | 13 | 0 | 5 | 10 | 15 | 12 | 7 | 2 | 4 |
| 10 | 4 | 9 | 14 | 11 | 6 | 1 | 3 | 8 | 13 | 0 | 5 | 10 | 15 | 12 | 7 | 2 |

Figure 5(b)

ky line acquisition order

| Position band number | | | | | | | | | | | | | | | |
|---|---|---|---|---|---|---|---|---|---|---|---|---|---|---|---|
| 1 | 0 | 5 | 10 | 15 | 12 | 7 | 2 | 4 | 9 | 14 | 11 | 6 | 1 | 3 | 8 | 13 |
| 2 | 13 | 0 | 5 | 10 | 15 | 12 | 7 | 2 | 4 | 9 | 14 | 11 | 6 | 1 | 3 | 8 |
| 3 | 8 | 13 | 0 | 5 | 10 | 15 | 12 | 7 | 2 | 4 | 9 | 14 | 11 | 6 | 1 | 3 |
| 4 | 3 | 8 | 13 | 0 | 5 | 10 | 15 | 12 | 7 | 2 | 4 | 9 | 14 | 11 | 6 | 1 |
| 5 | 1 | 3 | 8 | 13 | 0 | 5 | 10 | 15 | 12 | 7 | 2 | 4 | 9 | 14 | 11 | 6 |
| 6 | 0 | 5 | 10 | 15 | 12 | 7 | 2 | 4 | 9 | 14 | 11 | 6 | 1 | 3 | 8 | 13 |
| 7 | 13 | 0 | 5 | 10 | 15 | 12 | 7 | 2 | 4 | 9 | 14 | 11 | 6 | 1 | 3 | 8 |
| 8 | 8 | 13 | 0 | 5 | 10 | 15 | 12 | 7 | 2 | 4 | 9 | 14 | 11 | 6 | 1 | 3 |
| 9 | 3 | 8 | 13 | 0 | 5 | 10 | 15 | 12 | 7 | 2 | 4 | 9 | 14 | 11 | 6 | 1 |
| 10 | 1 | 3 | 8 | 13 | 0 | 5 | 10 | 15 | 12 | 7 | 2 | 4 | 9 | 14 | 11 | 6 |

MRI IMAGING OF AN OBJECT IN CYCLIC MOTION

FIELD OF THE INVENTION

The invention relates to image acquisition for magnetic resonance imaging (MRI), and in particular to a motion-resistant technique for image capture.

BACKGROUND AND PRIOR ART KNOWN TO THE APPLICANT

Magnetic resonance imaging has become established as a key technique for imaging the soft tissues of the body. MRI images are predominantly formed by the measurement of radio frequency signal emission during proton spin relaxation following an excitation signal to protons located in a magnetic field. The use of magnetic field gradients allows spatially encoded data to be acquired to form an image. The data are acquired in so-called "k-space", related via Fourier transform to the physical space from where an image is acquired—different positions in "k space" correspond to spatial frequency and phase information. The task of forming an MRI image can be viewed as acquiring lines in k-space ("ky lines") to span the entire k-space to be imaged, and then reconstructing the spatial image by Fourier transform.

The physics underlying magnetic resonance imaging relies on the relaxation time of protons (or, occasionally, the relaxation time of other NMR active nuclei), and so acquisition of sufficient data to form an image takes significant time in relation to expected movement of a subject to be imaged, such as a human body. This problem is particularly acute when imaging structures within the thorax of a subject, as they are subject to cyclic motion from the subject's breathing during a typical timescale for image acquisition. The problem is further exacerbated in the field of cardiac imaging, where the beating of the heart adds a second cyclic motion to the problem.

The problem has been addressed by the use of so-called 'navigator acceptance' imaging methods in which positional information is gathered effectively simultaneously with image data, but these have been hindered by the loss in scan efficiency which results from the changes in breathing pattern during a scan. The technique known as 'phase ordering with automatic window selection' (PAWS) provides a method which is resistant to changes in breathing whilst allowing the user the use of phase ordering to provide effective motion artifact reduction in an optimal time (Jhooti P, Gatehouse P D, Keegan J, Bunce N H, Taylor A M, Firmin D N. "Phase ordering with automatic window selection (PAWS): a novel motion-resistant technique for 3D coronary imaging", *Magnetic Resonance in Medicine,* 2000, March, 43(3):470-80.). The drawback of the PAWS technique is that images are only available once enough data has been acquired within the range of motion specified. Whilst the acquisition may terminate with the optimal scan time for the particular respiratory trace and acceptance window size, this optimal time may still be quite long.

Other techniques such as the Diminishing Variance Algorithm (DVA) acquire the whole image before attempting to limit the respiratory motion (Sachs T S, Meyer C H, Irarrazabal P, Hu B S, Nishimura D G, Macovski A., "The diminishing variance algorithm for real-time reduction of motion artifacts in MRI", *Magnetic Resonance in Medicine,* 1995, 34:412-422). Whilst DVA has the advantage of allowing scans to terminate at any point after the initial image has been corrected, the algorithm has been found to be less effective in subjects with a variable respiratory pattern (Jhooti et al, ibid).

The present invention attempts to combine the noted benefits of the DVA and PAWS technique to provide a methodology that enables images to be reconstructed quickly, and with all further data acquisition reducing the acceptance window and improving image quality, whilst ensuring that a scan terminates automatically in an optimal scan time for a given acceptance window size regardless of respiratory pattern.

SUMMARY OF THE INVENTION

The invention provides improved scan efficiency using Multiple Interleaved Acquisitions for Optimal Windows, thus termed MIAOW.

In particular, the invention provides a method of generating a magnetic resonance image of an object in cyclic motion, comprising the steps of:
(a) defining a desired acceptance window corresponding to an extent of motion over which image data may be combined;
(b) defining a series of position bands, together covering the total range of expected motion, to enable object positions within that range to be assigned to one of said bands, the range of motion corresponding to at least one of said bands being less than or equal to the acceptance window, and dividing said series of position bands into a number of groups, each group containing a number of adjacent position bands;
(c) selecting a required image resolution, thus defining the number of ky lines to be acquired;
(d) generating a Icy line acquisition order for a first position band, said order having the features that:
(i) each ky line to be acquired is included in the order;
(ii) each successive line to be acquired is spaced apart across the ky space;
(e) generating a ky line acquisition order for each of the other position bands, such that the acquisition order for each band within a group is circularly shifted by one place with respect to the order for its adjacent band;
(f) measuring the object position, and determining which position band corresponds to said object position;
(g) substantially simultaneously with step (i), acquiring data corresponding to the next ky line to be acquired for said corresponding position band, according to the line acquisition order for that position band;
(h) determining whether data have been acquired for each ky line across the ky space, in any position band, and if so:
(i) identifying the set of position bands containing all ky lines that corresponds to a minimum range of motion; and
(ii) using the ky data in that set of position bands to construct and display an image;
(i) determining whether the range of motion corresponding to the set of position bands identified in step (h)(i) is greater than the desired acceptance window, and if so, repeating the process from step (f).

In one preferred aspect of the invention, all the position bands defined in step (b), above, are allocated to a single group.

A typical acceptance window for routine diagnostic imaging in medicine might be 5 mm, and so a typical position band width might be of the order of 1 mm. In this field, relatively high-resolution images of 256 pixels square might be required, but for other purposes the image might be as coarse as 64×64 pixels. In the examples given below a smaller resolution of 16×16 pixels is used for illustrative purposes, and to most easily clarify the method steps. Thus, in the examples, the acquisition of 16 ky lines is required. Spacing the lines apart in ky space—step (d) above—ensures that data re acquired across the spatial frequency spectrum during the acquisition, rather than being bunched together at one or only a few locations (as with the PAWS technique). In this way, the probability of acquiring enough data to form an image at an early stage is maximized.

In generating acquisition orders for adjacent position bands, using a circularly shifted pattern of acquisition orders ensures that the ky space is filled as quickly as possible, and in position bands close to each other.

Measurement of the object position—in step (f)—may conveniently be carried out using an anatomical datum point such as the diaphragm, which itself can be located using an MRI line image along the midline of a patient. Other methods of position determination could also be used, such as laser-based distance measurement, mechanical sensors or ultrasonic transduction.

In step (h), a set of position bands is identified corresponding to a minimum range of motion. By minimum range, we mean those data having the greatest "central tendency". For an initial assessment, the strict algebraic range is a good measure, and easily calculated. However, where more than one set of bands span the entire range of ky lines, more sophisticated measures such as the standard deviation of object positions may be used to select the position bands most likely to create an image with least motion artifact.

The method has the advantage that an image may be formed at an early stage of the process, even though the desired acceptance window has not been achieved. As a result, it is advantageous that the method is further characterised by means to allow an operator, in use, to terminate the method after an image has been displayed in step (h)(ii). In this way, an operator does not have to wait for the method to complete to the desired acceptance window size if an early image proves to be "good enough".

The method has been found to be particularly effective when the ky line acquisition order generated in step (d), above, is selected by the steps of:
(i) choosing an integer, n, where n is greater than unity and less than half the number of ky lines to be acquired;
(ii) selecting a first ky line to be acquired;
(iii) selecting the order of a first subset of lines to be acquired to be each nth line across ky space, working from one side of ky space to the other;
(iv) selecting the order of the next subset of lines to be acquired to be each nth line across ky space, beginning with a line such that the said next subset of lines is interleaved with lines already acquired;
(v) repeating step (iv) for further subsets of lines, until each required ky line is included in the order.

This stepwise interleaving of the ky line acquisition order provides particularly effective coverage of the whole frequency spectrum and leads to reduced image acquisition times. Preferably, the choice of beginning line in step (iv), above, is such as to position the said next subset of lines in the middle of lines yet to be acquired. This variation serves to "fill in the gaps" in the frequency spectrum quickly and effectively. More preferably, when the ky line acquisition order is generated in a stepwise fashion as above, the order of acquisition of the said next subset of ky lines is in the opposite direction across ky space to the precedingly acquired subset of lines. In this way, ky lines are acquired evenly at each end of the ky space during the data collection.

It has also been found that when generating a stepwise acquisition order, it is particularly advantageous that the integer n is a power of two (i.e. 2, 4, 8, etc.). In this way, interpolation of ky data is possible, allowing intermediate images of a reduced resolution to be formed during the data acquisition cycle.

Included within the scope of the invention is a method of generating a magnetic resonance image of an object in cyclic motion substantially as described herein, with reference to and as illustrated by an appropriate combination of the accompanying drawings.

Also included within the scope of the invention is a magnetic resonance imaging heart monitor configured to use a method according to any preceding claim.

Whilst the term "ky lines" has been used throughout this specification, and in the claims, it should be understood that this is not intended to limit the scope of the invention to any particular spatial direction, and should be taken to include other directions including those often referred to in the art as "kx lines" and "kz lines".

BRIEF DESCRIPTION OF THE DRAWINGS

The invention will be described with reference to the accompanying drawings, and in which.

DESCRIPTION OF THE PREFERRED EMBODIMENTS

The invention will now be further described by a series of embodiments, illustrating various ways it may be implemented.

Embodiment 1

'Spaced Part' Acquisition Order

Figure 1:
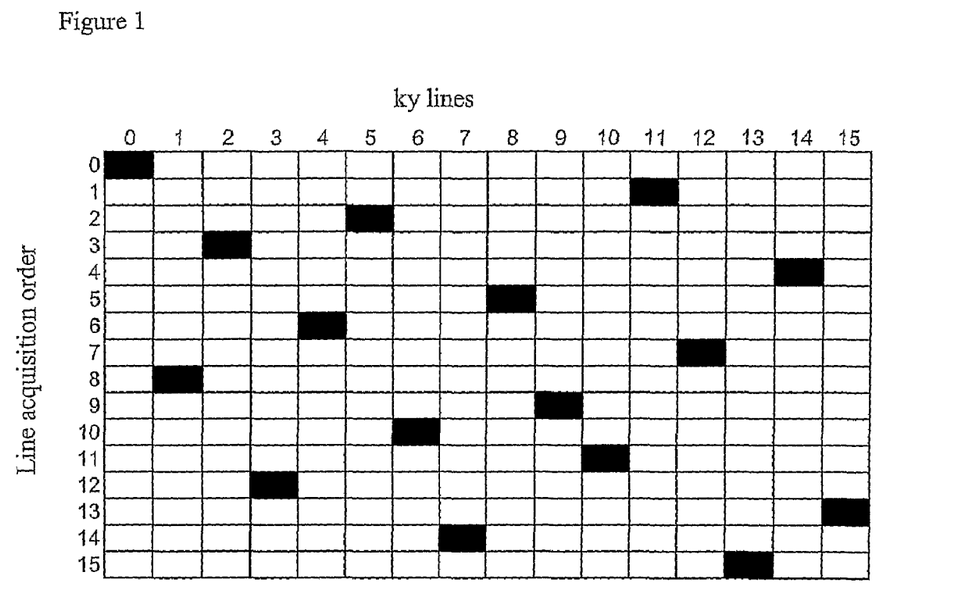
FIG. 1 illustrates a 'spaced apart' acquisition order for ky lines.

FIG. 1 illustrates a scheme for a ky line acquisition where the order of lines is spaced apart across the ky space. For illustrative purposes only, a situation where 16 ky lines are to be acquired is illustrated. Each column in the grid represents one line, and the black squares represent the order in which the lines are to be acquired, each acquisition step being represented by a row in the grid. Thus, in this example, the predetermined order for ky line acquisition is as follows:

| 0 | 11 | 5 | 2 | 14 | 8 | 4 | 12 | 1 | 9 | 6 | 10 | 3 | 15 | 7 | 13 |
|---|----|---|---|----|---|---|----|---|---|---|----|---|----|---|----| i.e. the left-most ky line (line 0) is collected first, followed by line 11, line 5 etc., and finally collecting line 13.

It can be seen that, in this illustration, each subsequent ky line to be acquired is spaced apart across the entire ky space to ensure that, as the data are collected, signal collection is carried out for all frequency bands, rather than being concentrated merely at one end of ky space.

Embodiment 2

Interleaved Acquisition Order (N=6)

Figure 2:
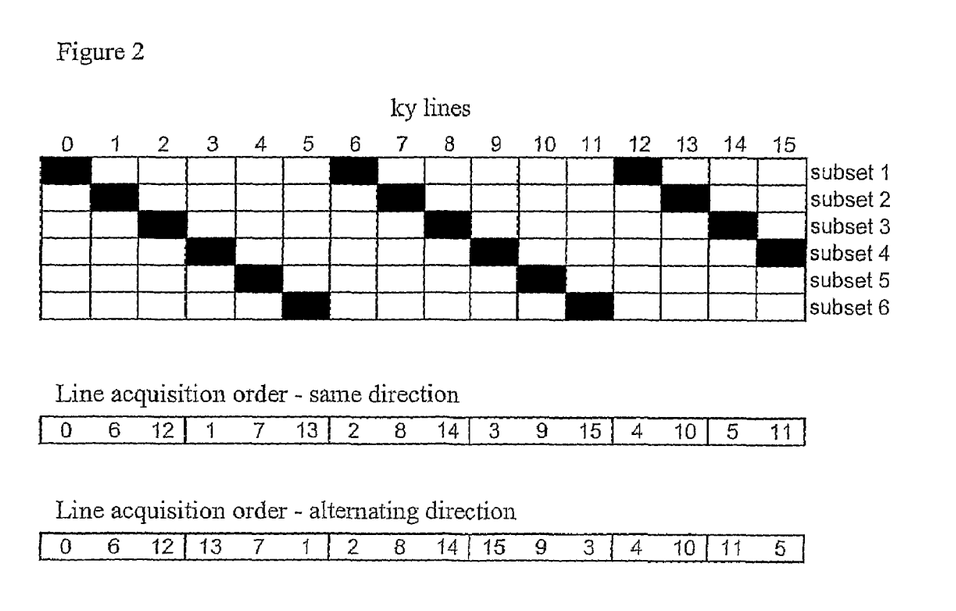
FIG. 2 illustrates an interleaved acquisition order for ky lines with and without a direction change.

FIG. 2 illustrates a scheme for determining a ky acquisition order comprised of subsets of lines to be acquired, with each subset comprising lines equally spaced across the ky space; in this instance, each subset contains every sixth line in the ky space, from one side to the other. It can be seen that each subsequent subset is interleaved with the preceding one thus covering the entire ky space with 6 subsets. Thus, if the acquisition direction is the same for each subset, the acquisition order will be:

| subset 1 | | | subset 2 | | | subset 3 | | | subset 4 | | | subset 5 | | subset 6 | |
|---|---|---|---|---|---|---|---|---|---|---|---|---|---|---|---|
| 0 | 6 | 12 | 1 | 7 | 13 | 2 | 8 | 14 | 3 | 9 | 15 | 4 | 10 | 5 | 11 | and if the acquisition order of each successive subset is reversed, then the order will be:

| subset 1 | | | subset 2 | | | subset 3 | | | subset 4 | | | subset 5 | | subset 6 | |
|---|---|---|---|---|---|---|---|---|---|---|---|---|---|---|---|
| 0 | 6 | 12 | 13 | 7 | 1 | 2 | 8 | 14 | 15 | 9 | 3 | 4 | 10 | 11 | 5 |

Embodiment 3

Figure 3:
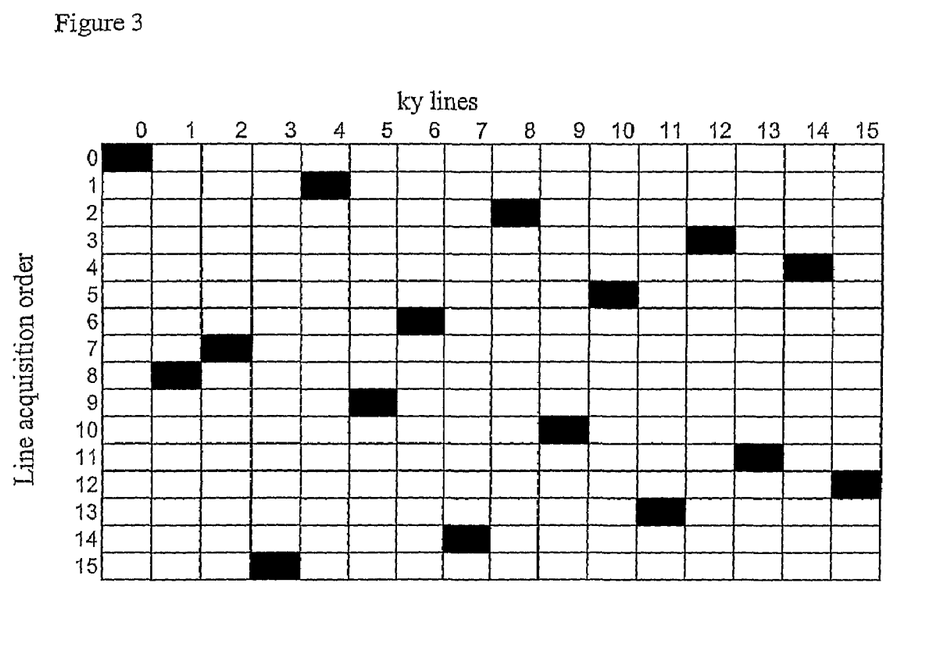
FIG. 3 illustrates a spaced stepwise apart ky line acquisition order with centering and direction change.

FIG. 3 illustrates a line acquisition scheme, again illustrated for an image acquisition comprising 16 ky lines. In this case, each subset of lines is spaced apart across the ky space by selecting each fourth line per subset. Each successive subset is then chosen such that it is spaced, and preferably centered, between those ky lines already acquired, so as to 'fill in the gaps' evenly across ky space. In this embodiment, successive subsets of ky line acquisition traverse the ky space in alternating directions. The ky line acquisition order is thus:

| subset 1 | | | | subset 2 | | | | subset 3 | | | | subset 4 | | | |
|---|---|---|---|---|---|---|---|---|---|---|---|---|---|---|---|
| 0 | 4 | 8 | 12 | 14 | 10 | 6 | 2 | 1 | 5 | 9 | 13 | 15 | 11 | 7 | 3 |

Embodiment 4

Interleaved Centered Acquisition Order (N=5)

Figure 4:
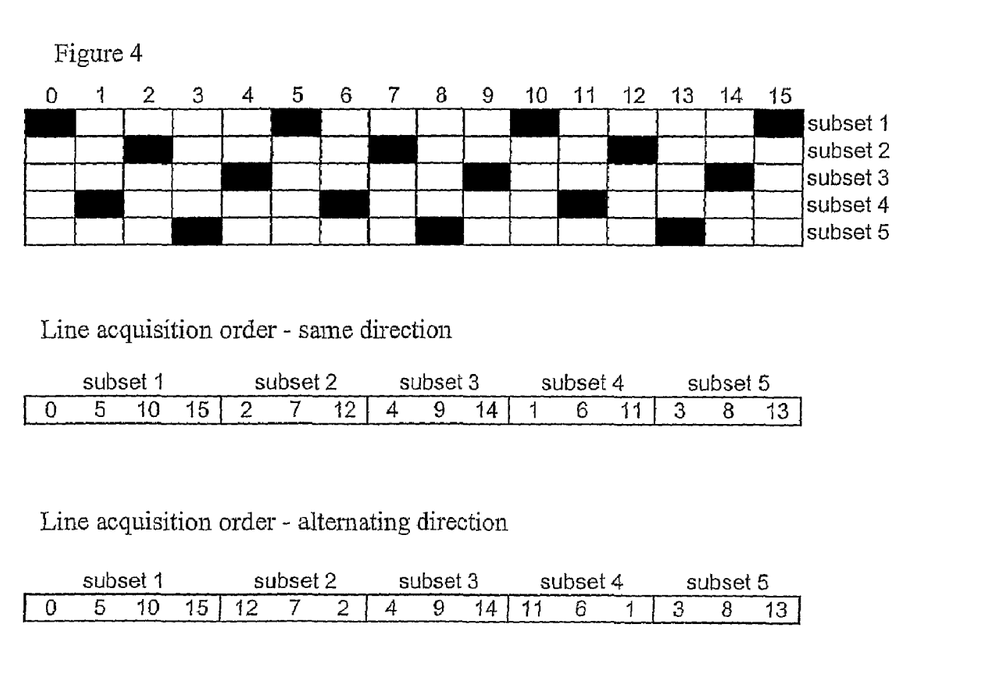
FIG. 4 illustrates a stepwise spaced apart ky line acquisition order, for a larger stepwise, with and without direction change.

FIG. 4 illustrates a scheme for line acquisition, this time using N=5 to step across the ky space. Again, in this scheme, each successive subset of lines is interleaved with preceding subsets, and spaced, preferably centered between lines already acquired. Thus, the acquisition order for each of the lines is:

| subset 1 | | | subset 2 | | | subset 3 | | | subset 4 | | | subset 5 | | |
|---|---|---|---|---|---|---|---|---|---|---|---|---|---|---|
| 0 | 5 | 10 | 15 | 2 | 7 | 12 | 4 | 9 | 14 | 1 | 6 | 11 | 3 | 8 | 13 |

And if the acquisition order of successive subsets is reversed, the line acquisition order would be:

| subset 1 | | | subset 2 | | | subset 3 | | | subset 4 | | | subset 5 | | |
|---|---|---|---|---|---|---|---|---|---|---|---|---|---|---|
| 0 | 5 | 10 | 15 | 12 | 7 | 2 | 4 | 9 | 14 | 11 | 6 | 1 | 3 | 8 | 13 |

Embodiment 5

Acquisition Order for each Position Band

Figure 5A:
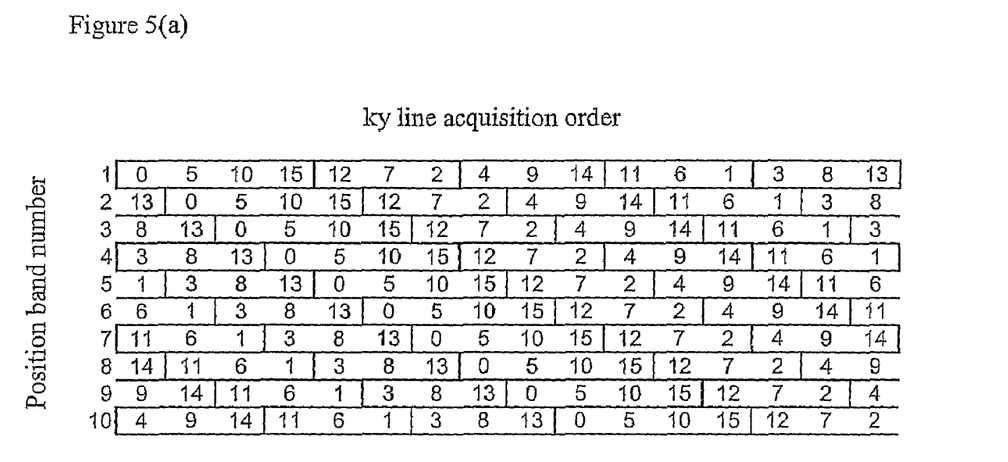
FIG. 5 illustrates the shifting of ky acquisition orders for adjacent position bands.

FIG. 5(a) illustrates the generation of a ky line acquisition order for a number of position bands corresponding to the cyclic motion of an object to be imaged, using the ky line acquisition order of embodiment 4, and with successive subsets having a reversed order. In this example, 10 such position bands are illustrated and the acquisition order determined in embodiment 4 is chosen to be the order for band 1, although it could equally correspond to another position band. It can be seen from FIG. 5 that each position band has been placed into a single group, and that the line acquisition order for each adjacent position band is circularly shifted one place to the right with respect to the preceding adjacent band.

Figure 5B:
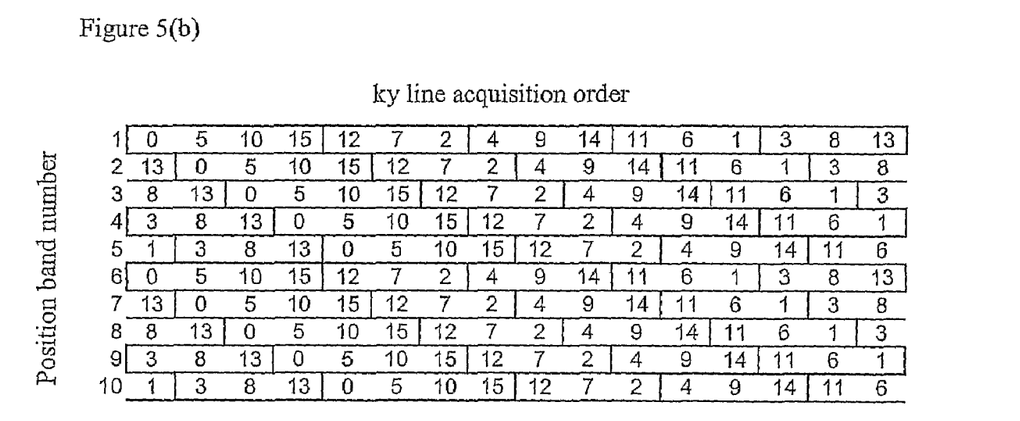

FIG. 5(b) illustrated a line acquisition order wherein the position bands have been divided into two groups (bands 1-5, and bands 6-10). The acquisition order for adjacent bands within each group is circularly shifted with respect to the neighbouring band. The acquisition order for the first of the groups has then been repeated for the second group.

Clearly, small variations in shifting could be implemented within the scope of the present invention, but this particular shifting pattern is considered optimal for the acquisition of high quality images in the minimum time.

Illustration of Image Acquisition

Figure 6:
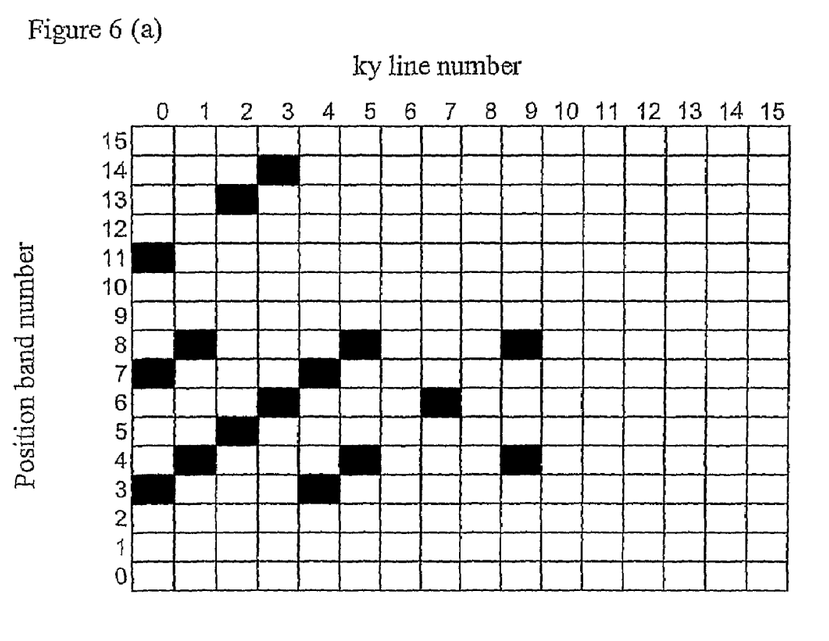
FIG. 6 illustrates a series of acquired ky lines during a typical scan cycle.

FIG. 6 illustrates the application of the scheme to the acquisition of an image of the heart in the face of breathing-induced movement. In this example, a ky line acquisition order for each band has been generated using N=4, with each successive subset reversing its acquisition order across ky space, as illustrated in embodiment 3 above.

In this example, the MRI image to be acquired was that of the heart, and so the acquisition of each ky line was synchronised with the cardiac rhythm to ensure that the heart was in the same contraction state during each line acquisition. The desired acceptance window in this instance was 2 mm. The range of positioning expected was broken in 16 1 mm slices, or position bands, represented by the position band numbers 0 to 15. When triggered by a heartbeat, the position of the heart in the thorax was determined by measuring the position of the diaphragm, conveniently by means of a linear magnetic resonance image along the midline of the body. From this measurement, it was determined which of the 16 position bands the heart occupied. The identity of the next ky line to be acquired was thus determined from the pre-set order and the scanner equipment manipulated appropriately to acquire that line.

FIG. 6*a* illustrates the situation after 16 cardiac cycles. It can be seen that the pattern of breathing, in relation to each ky line acquisition, has been such that most of the ky data has been acquired with the heart within positions 3 to 8 (illustrated by the filled squares in the grid). A number of ky lines (e.g. lines 10 to 15) have yet to be acquired in any diaphragm position, and so no image formation is yet possible.

FIG. 6*b* illustrates the situation after 29 cardiac cycles. A total of 29 ky lines have now been acquired, and it can be seen that the data acquired in positions 3 to 6 cover the entire ky space. The positions marked with an 'X' in the grid represent the set of data spanning all ky lines, and corresponding to a minimum range of motion. In this instance, the range of diaphragm positions reflected in this data set covers a range of 4 mm (positions 3 to 6), with a standard deviation in diaphragm position of 1.155. An image may now be formed, and displayed to a user, using these data.

FIG. 6*c* illustrates the situation after 40 cardiac cycles. In this case, a new set of position bands has been identified (bands 2 to 5) containing a set of all ky lines corresponding to a smaller range of motion. Although the range of motion is again 4 mm, the standard deviation of position in this set is reduced to 1.000; the smaller standard deviation is a reflection of most of the data being clustered in position bands 2 to 4, with only two ky lines being acquired in position band 5. Therefore, an image may be formed using these data and having less motion artifact than those formed from the data in FIG. 6*b*.

FIG. 6*d* illustrates the situation after 51 cardiac cycles. At this point, a complete set of ky lines has been acquired in only two position bands (bands 2 and 3). Thus, the total range of motion reflected in this data set is now only 2 mm, i.e. equal to the width of the desired acceptance window. A final image may therefore be constructed from these data, displayed to a user, and the method terminated.

The same data set was analysed using PAWS (Jhooti P, Gatehouse P D, Keegan J, Bunce N H: Taylor A M, Firmin D N. "Phase ordering with automatic window selection (PAWS): a novel motion-resistant technique for 3D coronary imaging", *Magnetic Resonance in Medicine*, 2000, March, 43(3):470-80) and image acquisition with the present technique is over 40% faster than the most efficient scan time using PAWS with a 2 mm acceptance window, and almost 30% quicker when a 6 mm acceptance window is used.

The invention claimed is:

1. A method of generating a magnetic resonance image of an object in cyclic motion, comprising the steps of:
   (a) defining a desired acceptance window corresponding to an extent of motion over which image data may be combined;

(b) defining a series of position bands, together covering the total range of expected motion, to enable object positions within that range to be assigned to one of said bands, the range of motion corresponding to at least one of said bands being less than or equal to the acceptance window, and dividing said series of position bands into a number of groups, each group containing a number of adjacent position bands;

(c) selecting a required image resolution, thus defining the number of ky lines to be acquired;

(d) generating a ky line acquisition order for a first position band, said order having the features that:
  (i) each ky line to be acquired is included in the order;
  (ii) each successive line to be acquired is spaced apart across the ky space;

(e) generating a ky line acquisition order for each of the other position bands, such that the acquisition order for each band within a group is circularly shifted by one place with respect to the order for its adjacent band;

(f) measuring the object position, and determining which position band corresponds to said object position;

(g) substantially simultaneously with step (f), acquiring data corresponding to the next ky line to be acquired for said corresponding position band, according to the line acquisition order for that position band;

(h) determining whether data have been acquired for each ky line across the ky space, in any position band, and if so:
  (i) identifying the set of position bands containing all ky lines that corresponds to a minimum range of motion; and
  (ii) using the ky data in that set of position bands to construct and display an image;

(i) determining whether the range of motion corresponding to the set of position bands identified in step (h)(i) is greater than the desired acceptance window, and if so, repeating the process from step (f).

2. The method of claim 1 wherein all the position bands defined in step (b) are allocated to a single group.

3. The method of either of claims 1 and 2 further characterised by means to allow an operator, in use, to terminate the method after an image has been displayed in step (h)(ii).

4. A method according to claim 3 wherein the Icy line acquisition order generated in step (d) is selected by the steps of:

(i) choosing an integer, n, where n is greater than unity and less than half the number of ky lines to be acquired;
  (ii) selecting a first ky line to be acquired;
  (iii) selecting the order of a first subset of lines to be acquired to be each nth line across ky space, working from one side of ky space to the other;
  (iv) selecting the order of the next subset of lines to be acquired to be each nth line across ky space, beginning with a line such that the said next subset of lines is interleaved with lines already acquired;
  (v) repeating step (iv) for further subsets of lines, until each required ky line is included in the order.

5. A method according to claim 4 wherein the choice of beginning line in step (iv) is such as to position the said next subset of lines in the middle of lines yet to be acquired.

6. A method according claim 5 wherein the order of acquisition of the said next subset of ky lines is in the opposite direction across ky space to the precedingly acquired subset of lines.

7. A method according to claim 6 wherein the integer n is a power of two.

8. A magnetic resonance imaging heart monitor configured to use a method according to claim 3.

9. A magnetic resonance imaging heart monitor configured to use a method according to claim 1 or claim 2.

10. A method according to claim 1 wherein the ky line acquisition order generated in step (d) is selected by the steps of:

(i) choosing an integer, n, where n is greater than unity and less than half the number of ky lines to be acquired;
  (ii) selecting a first ky line to be acquired;
  (iii) selecting the order of a first subset of lines to be acquired to be each nth line across ky space, working from one side of ky space to the other;
  (iv) selecting the order of the next subset of lines to be acquired to be each nth line across ky space, beginning with a line such that the said next subset of lines is interleaved with lines already acquired;
  (v) repeating step (iv) for further subsets of lines, until each required ky line is included in the order.

11. A method according to claim 10 wherein the order of acquisition of the said next subset of ky lines is in the opposite direction across ky space to the precedingly acquired subset of lines.

* * * * *